(12) United States Patent
Sano (10) Patent No.: US 8,981,247 B2
(45) Date of Patent: Mar. 17, 2015

(54) INPUT DEVICE

(71) Applicant: Alps Electric Co., Ltd., Tokyo (JP)

(72) Inventor: Tadashi Sano, Miyagi-Ken (JP)

(73) Assignee: Alps Electric Co., Ltd., Tokyo (JP)

( * ) Notice: Subject to any disclaimer, the term of this patent is extended or adjusted under 35 U.S.C. 154(b) by 158 days.

(21) Appl. No.: 13/776,234

(22) Filed: Feb. 25, 2013

(65) Prior Publication Data

US 2013/0228440 A1    Sep. 5, 2013

(30) Foreign Application Priority Data

Mar. 1, 2012 (JP) ................................ 2012-045879

(51) Int. Cl.
*H01H 1/14* (2006.01)
*H01H 13/14* (2006.01)
*G05G 1/02* (2006.01)

(52) U.S. Cl.
CPC ................. *H01H 13/14* (2013.01); *G05G 1/02* (2013.01); *H03K 2217/9651* (2013.01)
USPC ............................ 200/534; 200/295; 200/283

(58) Field of Classification Search
CPC .................................. H01H 13/14; G05G 1/02
USPC ......... 200/534, 532, 535, 557, 559, 246, 269, 200/283, 295
See application file for complete search history.

(56) References Cited

U.S. PATENT DOCUMENTS

| | | | | |
|---|---|---|---|---|
| 4,742,198 A | * | 5/1988 | Martin et al. | 200/296 |
| 6,858,812 B2 | * | 2/2005 | Sasaki et al. | 200/344 |
| 6,952,197 B1 | * | 10/2005 | Nakamura et al. | 345/157 |
| 7,080,562 B2 | * | 7/2006 | Knowles et al. | 73/818 |
| 7,135,646 B2 | * | 11/2006 | Tan | 200/4 |
| 7,301,111 B2 | * | 11/2007 | Kondo et al. | 200/4 |
| 7,872,202 B2 | * | 1/2011 | Na et al. | 200/4 |
| 7,910,849 B2 | * | 3/2011 | Hibshman et al. | 200/344 |
| 7,960,665 B2 | * | 6/2011 | Sakai et al. | 200/345 |
| 8,411,423 B2 | * | 4/2013 | Dai | 361/679.01 |
| 2003/0234169 A1 | * | 12/2003 | Iwakiri | 200/341 |
| 2007/0096903 A1 | * | 5/2007 | Hibshman et al. | 340/540 |
| 2007/0235294 A1 | * | 10/2007 | Kang | 200/4 |
| 2007/0262954 A1 | * | 11/2007 | Na et al. | 345/156 |
| 2008/0047808 A1 | * | 2/2008 | Tan | 200/1 R |
| 2008/0068337 A1 | * | 3/2008 | Yim et al. | 345/160 |
| 2009/0032381 A1 | * | 2/2009 | Hu | 200/534 |

FOREIGN PATENT DOCUMENTS

| | | | | |
|---|---|---|---|---|
| EP | 1164698 A2 | * | 12/2001 | .......... H03K 17/975 |
| JP | 2006-126997 | | 5/2006 | |

* cited by examiner

*Primary Examiner* — Kyung Lee
(74) *Attorney, Agent, or Firm* — Brinks Gilson & Lione (57) ABSTRACT

A rear operation body is attached on a rear portion of a front case via a pair of front supporting plate springs. A front operation body is provided in a frontward of the front case and the front operation body and the rear operation body are connected via a penetration portion. A rear case is provided in a rearward of the front case, and a rear supporting plate spring is provided in the rear case. A flexible print substrate is provided in a frontward thereof and a plurality of detection members are mounted on the flexible print substrate. When an operation surface of the front operation body is pressed, the front supporting plate springs are deformed. Thereby, the rear operation body is moved such that any of the plurality of detection members is operated.

5 Claims, 8 Drawing Sheets

INPUT DEVICE

CLAIM OF PRIORITY

This application claims benefit of Japanese Patent Application No. 2012-045879 filed on Mar. 1, 2012, which is hereby incorporated by reference in its entirety.

BACKGROUND

1. Field of the Disclosure

The present disclosure relates to an input device capable of detecting an action position of a pressing operation force, which is imparted to an operation body, and more particularly to an input device having an improved operation touch as well as a large operation stroke.

2. Description of the Related Art

Input devices, which, when a pressing operation is performed on an operation body, are able to detect an action position of a pressing operation force which is imparted to the operation body, are disclosed in Japanese Unexamined Patent Application Publication No. 2006-126997 and the like.

A touch panel disclosed in Japanese Unexamined Patent Application Publication No. 2006-126997 is provided with a transparent panel covering a display which is supported by pressure sensors at the four corners thereof. When any position of the panel is pressed, the force is detected by the four pressure sensors, whereby the position of the panel where the pressing operation force is imparted is computed based on the load detected by the pressure sensors. The touch panel in the related art has a configuration in which each of main body portions of the plurality of pressure sensors is supported on a housing or a substrate, and an actuator protruding from the main body portions abuts on the panel.

In the related art, since the actuator of the pressure sensor in a fixed state is directly pressed by the panel, there is a problem that when the panel is pressed, the operating feeling is poor because the stroke is small.

SUMMARY

An input device includes an operation body, which has an operation surface for which a pressing operation is performed, a detection member which detects that the operation surface is operated, and a case having an opening portion on a front side thereof. The case includes the operation body which is disposed inside of the case such that the operation surface is exposed through the opening portion, a first elastic support member which elastically supports the operation body, and a second elastic support member which supports the detection member that is pressed by the operation body and is elastically deformed when the operation surface is operated. Also, the operation body includes an abutment portion abutting on an inner surface of the case.

In the configuration, when a pressing operation is performed on the operation body, pressure sensors are operated while the first elastic support member is deformed. Thereby the operating feeling is good. Furthermore, it is possible to expand the detection range of force to the entire stroke of the operation body, whereby it is easy to obtain detection output corresponding to the amount of pressing of the operation body. Thereby, it is possible to make the input device small and thin. In addition, the pressure sensor is held on the elastic support portion such that user's pressing force is not likely to impart excessive pressure to the pressure sensor. Also, there is no concern that the pressure sensor may be to be broken.

DESCRIPTION OF THE EXEMPLARY EMBODIMENTS

Figure 1:
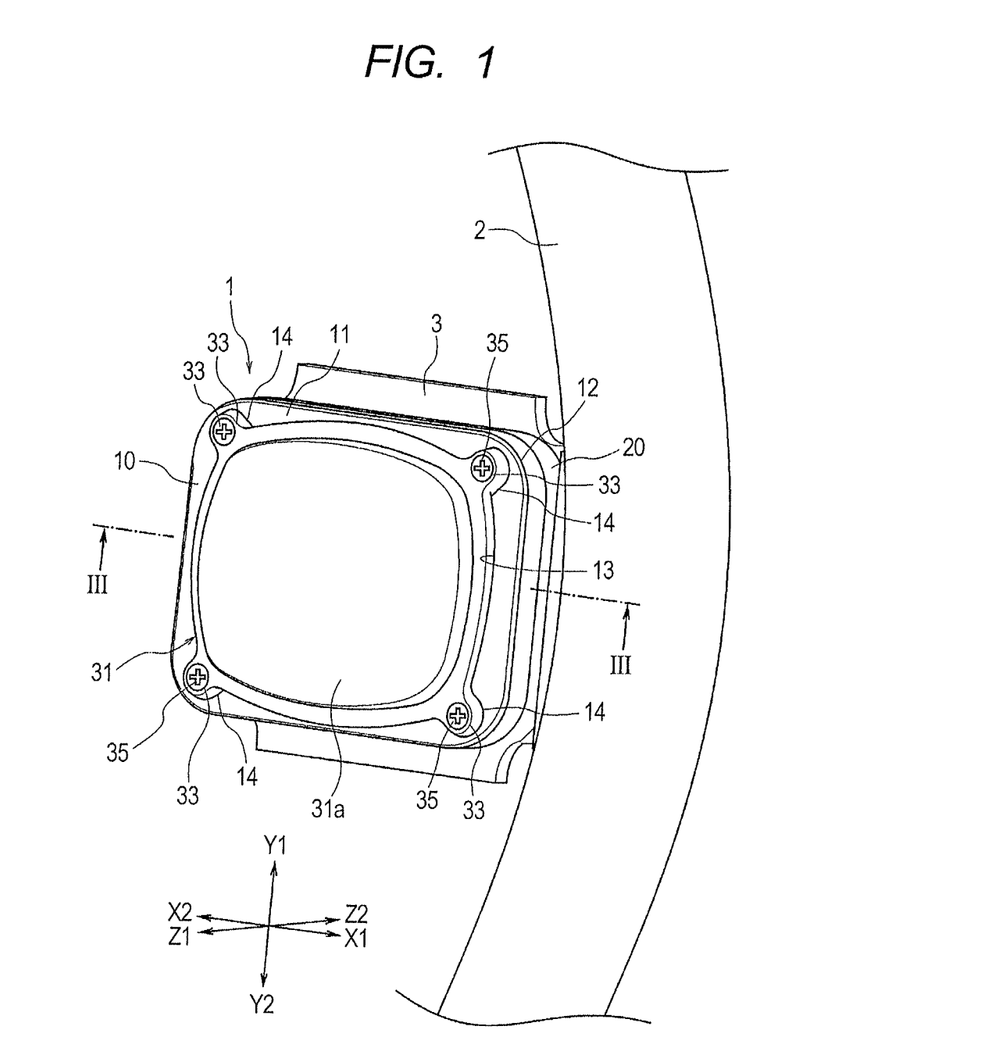
FIG. 1 is a perspective view showing an exterior appearance of an input device installed on a steering wheel, as an embodiment of the invention.

An input device 1 shown in FIG. 1 is for vehicles and is fixed to a front surface of a support plate 3, which extends from a steering wheel 2 for vehicles to an inner side thereof. Although a cover, which surrounds the input device 1, is provided at the inner side of the steering wheel, FIG. 1 shows a state in which the cover is removed.

In the input device 1, the Z1 direction and the Z2 direction are set as forward and rearward respectively, the X1 direction and the X2 direction are set as the right direction and left direction respectively, and the Y1 direction and the Y2 direction are set as upward and downward respectively.

Figure 3:
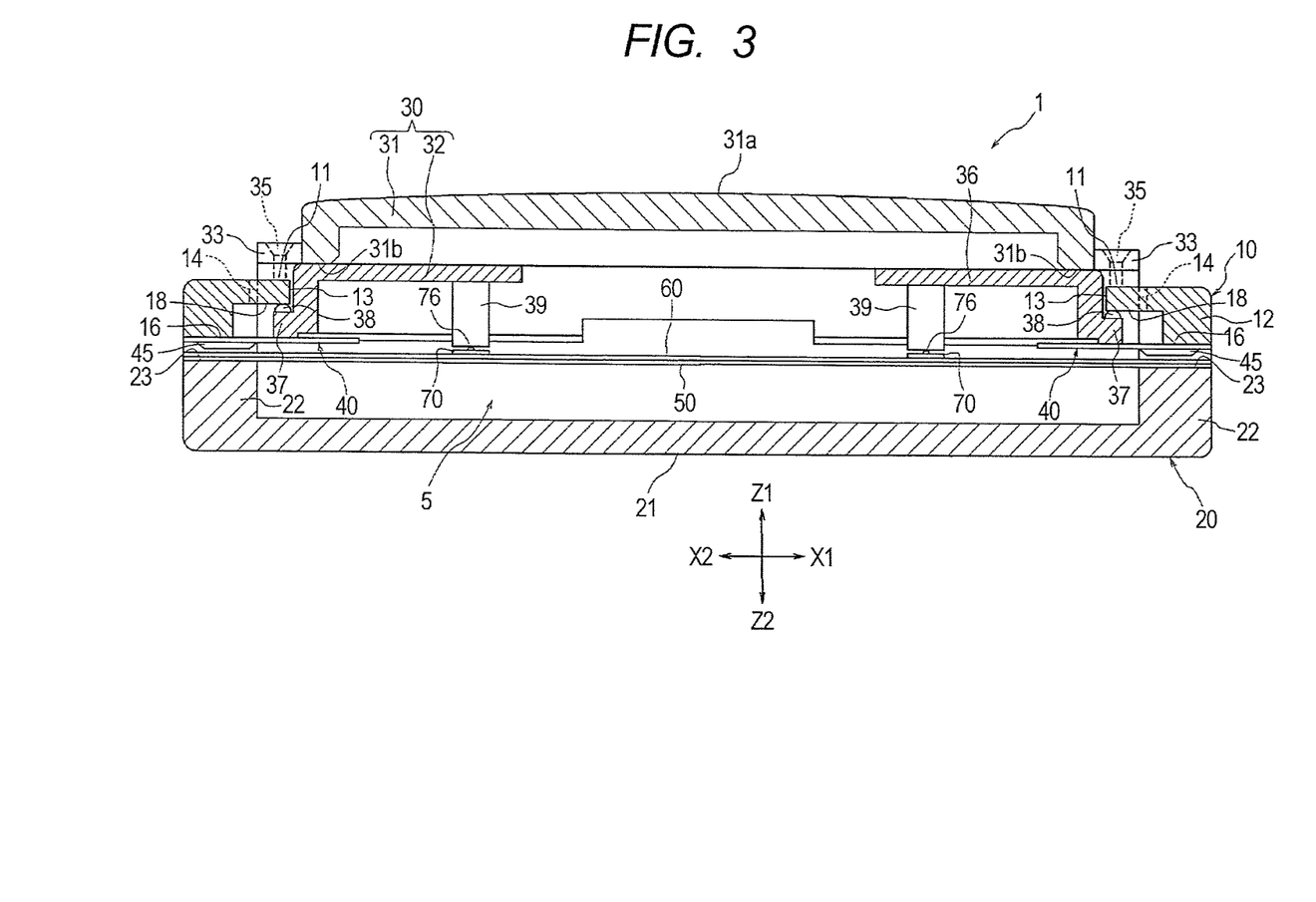
FIG. 3 is a cross-sectional view of the input device shown in FIG. 1 taken along line III-III.

As shown in FIG. 1 and FIG. 3, the input device 1 includes a front case 10 and a rear case 20. The front case 10 and the rear case 20 are assembled and fixed, and a support space 5 is formed inside thereof. The front case 10 and the rear case 20 are formed by die casting with light metals such as aluminum, or are formed by injection molding with synthetic resin materials.

An operation body 30 is supported on the front case 10, and detection member 70 is supported on the rear case 20. Also, an illustration of the rear case 20 is omitted in an exploded perspective view of FIG. 2.

Figure 2:
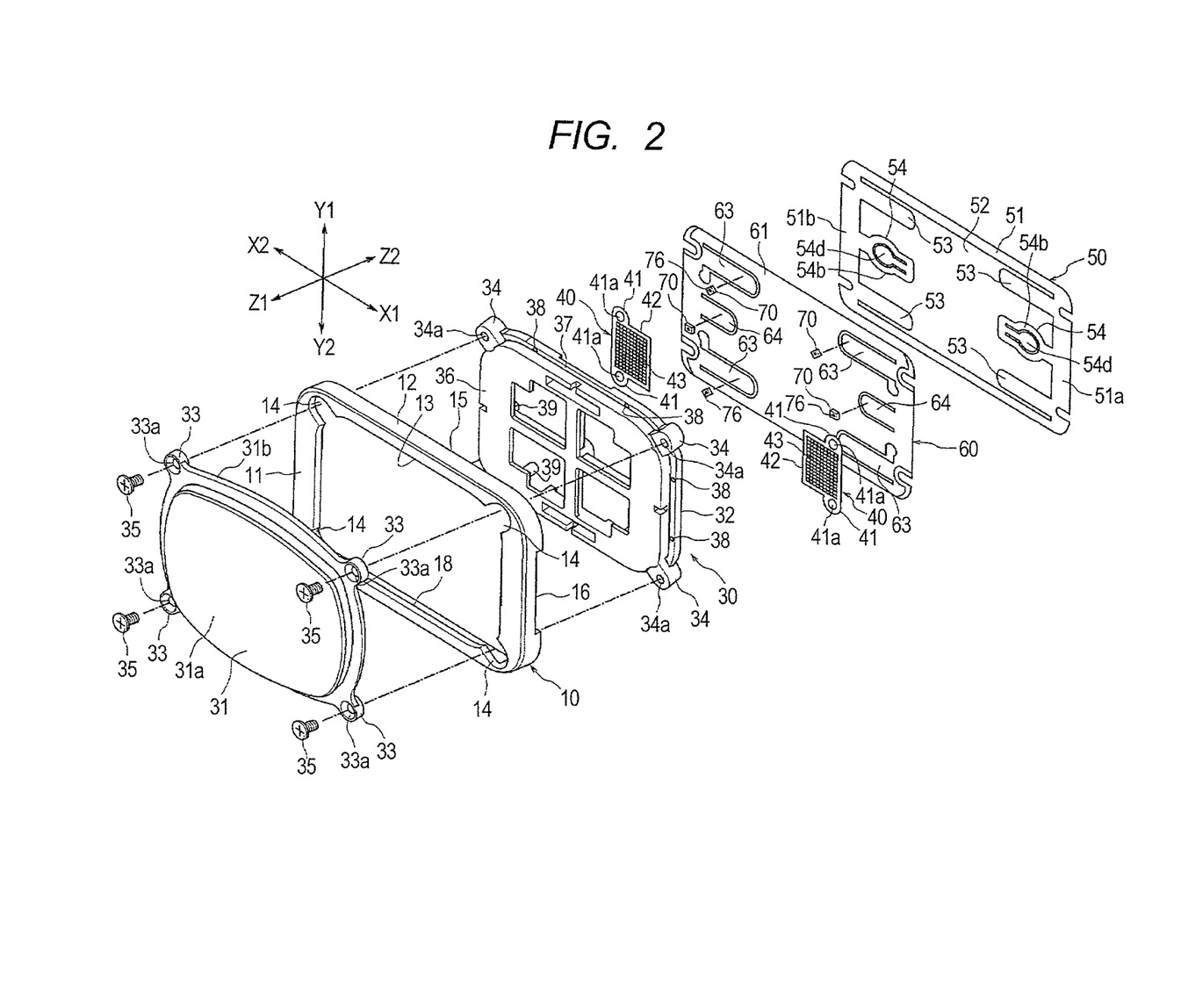
FIG. 2 is an exploded perspective view showing components of the input device.

As shown in FIG. 2 and FIG. 3, the front case 10 includes a front wall portion 11 and a peripheral wall portion 12. The front case 10 is formed in a rectangular shape, and the peripheral wall portion 12 is continuously formed along the four side surfaces thereof.

In the front wall portion 11 of the front case 10, an opening portion 13 is formed which penetrates in the front-rear direction (the Z1-Z2 direction). The opening portion 13 is formed in a rectangular shape with the long side directed in the right-left direction (the X1-X2 direction). At each of the four corners of the opening portion 13, a semicircular penetration portion 14, which penetrates in the front-rear direction, is continuously formed with the opening portion 13.

Figure 4:
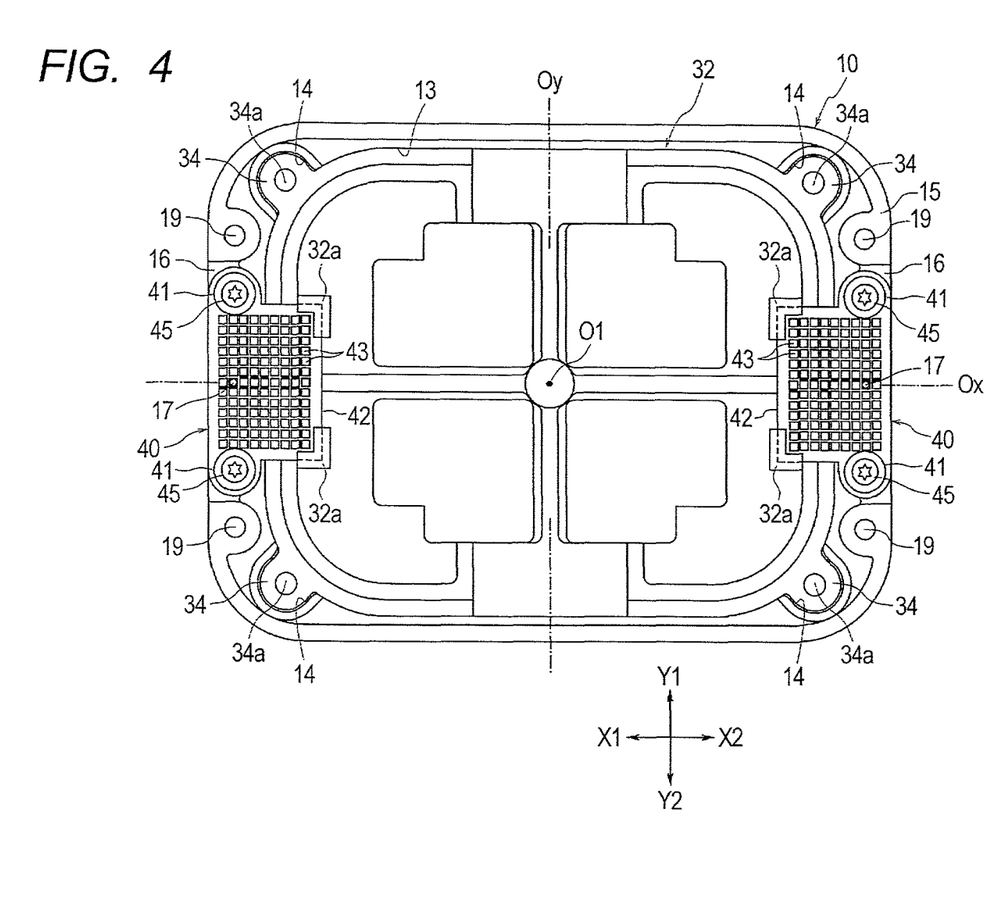
FIG. 4 is a rear view showing a state in which an operation body is attached to a case by a front supporting plate spring.
Figure 5:
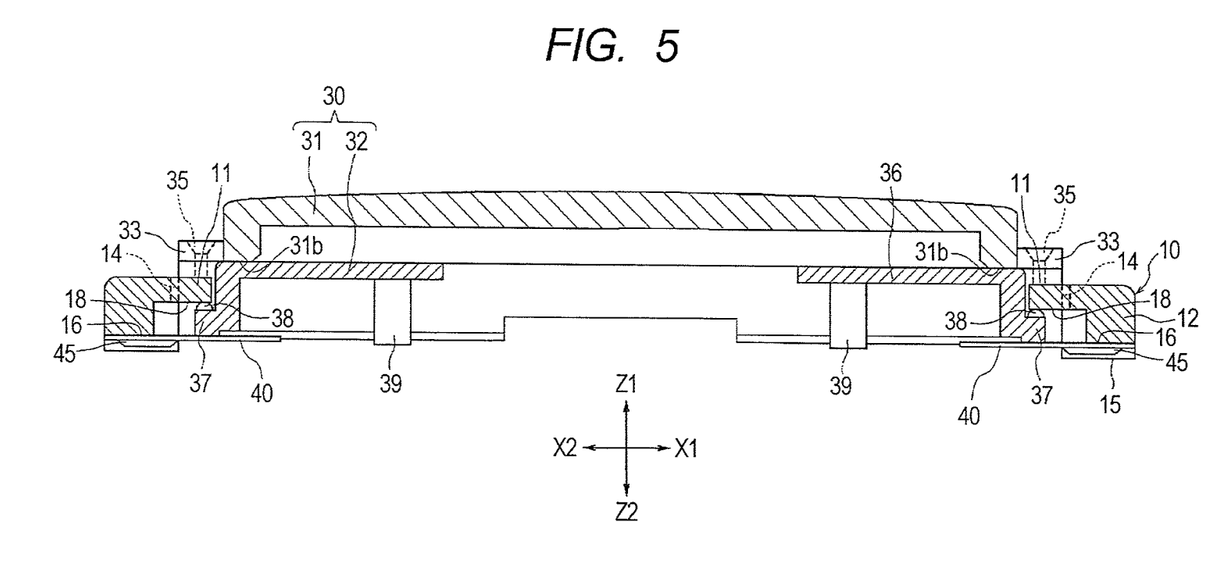
FIG. 5 is a cross-sectional view showing a state in which the operation body is attached to the case.

As shown in FIG. 2, FIG. 4 and FIG. 5, in the rear portion of the front case 10, a binding surface 15 to bind to the rear case 20 is formed on a rear end surface of the peripheral wall portion 12. Likewise, in the rear portion of the front case 10, plate spring attachment surfaces 16, 16 are formed at recessed positions disposed in the right-left direction (the X1-X2 direction) and recessed from the binding surface 15 in the frontward (the Z1 direction). A pair of female thread holes is formed at each of the plate spring attachment surfaces 16, 16. Also, between the two female thread holes, positioning protrusions 17, 17 (see FIG. 4) are integrally formed protruding rearward.

As shown in FIG. 5, a rear surface of the front wall portion 11 of the front case 10 is an operation body supporting surface 18. The operation body supporting surface 18 is formed so as to surround the periphery of the opening portion 13. The binding surface 15, the plate spring attachment surfaces 16, 16 and the operation body supporting surface 18 are disposed on a plane parallel to the X-Y plane.

The operation body 30 includes a front operation body 31 and a rear operation body 32. The front operation body 31 and the rear operation body 32 are formed by die casting with light metals such as aluminum, or are formed by injection molding with synthetic resin materials.

As shown in FIG. 2, the front operation body 31 is formed in a rectangular shape with the long side directed in the right-left direction (the X1-X2 direction). A front surface thereof is an operation surface 31a. At each of the four corners of the front operation body 31, a connection portion 33 is integrally formed so as to protrude. Also, each of the connection portion 33 extends longer than a rear surface 31b of the front operation body 31 in the rearward (the Z2 direction). The rear operation body 32 is formed in a rectangular shape the same as the front operation body 31. At each of the four corners of the rear operation body 32, a connection portion 34 is integrally formed so as to protrude. Also, attachment holes 33a are formed on the connection portions 33 of the front operation body 31 respectively, and female thread holes 34a are formed on the connection portions 34 of the rear operation body 32 respectively.

As shown in FIG. 2 and FIG. 5, in the rear operation body 32, a main body portion 36 which is formed in a rectangular shape and a flange portion 37 which integrally protrudes from the periphery of the main body portion 36 in the rearward (the Z2 direction) are integrally formed. On the surface of the flange portion 37 toward the frontward, a plurality of abutment protrusions 38 are integrally formed. The surface of the abutment protrusion 38 is convexed and has an almost hemisphere shape.

As shown in FIG. 5, the main body portion 36 of the rear operation body 32 is inserted in the opening portion 13 of the front case 10 from the rearward toward the frontward (the Z1 direction). The abutment protrusions 38 which are formed on the flange portion 37 meet the operation body supporting surface 18 which is a rear surface of the front wall portion 11 of the front case 10, in which the meet portions thereof are abutment portions between the front case 10 and the rear operation body 32.

Figure 6:
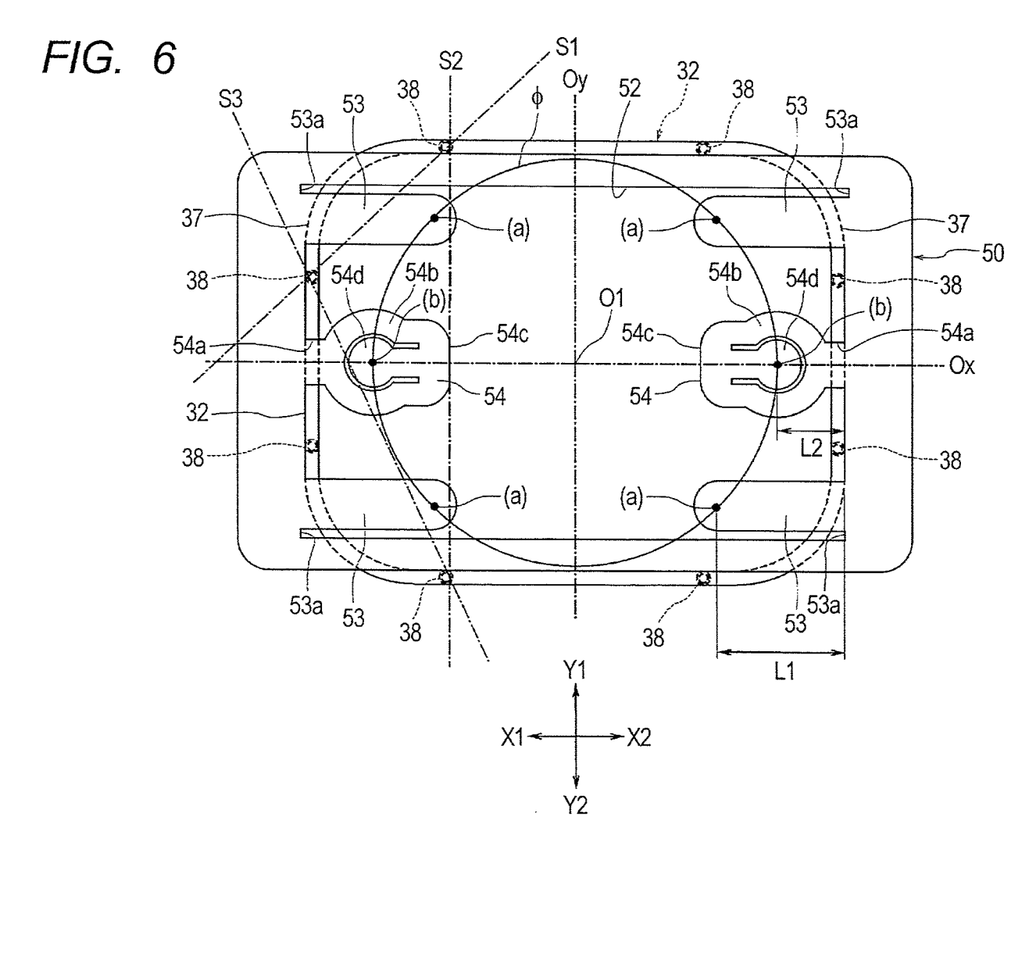
FIG. 6 is a rear view showing positional relation between the operation body, a detection member and a rear supporting plate spring.

As shown in FIG. 6, the abutment portions between the abutment protrusions 38 and the operation body supporting surface 18 are arranged symmetrically in the right direction (the X1 direction) and in the left direction (the X2 direction) while interposing an up-down centerline Oy therebetween, in which the up-down centerline Oy passes through a center (that is, the centroid) O1 of the rear operation body 32. Also, the abutment portions are arranged symmetrically in the up-down direction (the Y1-Y2 direction) while interposing a right-left centerline Ox therebetween, in which the right-left centerline Ox passes through the center O1.

The connection portion 33 of the front operation body 31 is inserted into the penetration portion 14 which is formed in the front case 10, and the connection portion 33 and the connection portion 34 of the rear operation body 32 meet each other. Additionally, each of four attaching screws 35 is inserted into an attaching hole 33a of the connection portion 33, and threadedly fixed to the female thread hole 34a of the connection portion 34. Thereby, the front operation body 31 and the rear operation body 32 are connected so as to be move integrally.

The rear operation body 32 is elastically supported on the front case 10 by a pair of front supporting plate springs 40 (which are first elastic support members). The size of the rear operation body 32 in the Z direction is slightly larger than the size from the rear surface 31b of the front operation body 31 to the plate spring attachment surface 16 so as to elastically support the rear operation body 32 by the front supporting plate spring 40. The two front supporting plate springs 40, 40 are the same and are arranged symmetrically in the right-left direction while interposing the up-down centerline Oy therebetween. As shown in FIG. 2 and FIG. 4, each of the front supporting plate springs 40 includes attachment base portions 41, 41 and a quadrangular-shaped elastic support portion 42. Large numbers of holes 43 are formed on the elastic support portion 42 and a frame part of fixed width is formed at the outer periphery thereof. Each of the holes 43 is formed in a square shape and the plurality of holes 43 are regularly arranged in the right-left direction (the X1-X2 direction) and the up-down direction (the Y1-Y2 direction). Also, an attaching hole 41a having a circular shape is formed on the attachment base portion 41.

As shown in FIG. 4, a positioning regulation portion 32a is integrally formed in a rear portion of the rear operation body 32. The positioning regulation portions 32a are provided in four places, in which the positioning regulation portions 32a are arranged spaced at the same distances in the right-left direction (the X1-X2 direction) while interposing the up-down centerline Oy and are arranged likewise spaced at the same distances in the up-down direction (the Y1-Y2 direction) while interposing the right-left centerline Ox.

A tip portion of the elastic support portion 42 of the front supporting plate spring 40 is inserted between a pair of the positioning regulation portions 32a, which are arranged in the up-down direction. The two sheets of front supporting plate spring 40 and the rear operation body 32 are firmly connected in a state in which the attitude thereof is stable without relatively moving in the right-left direction (the X1-X2 direction) and in the up-down direction (the Y1-Y2 direction) as well as without looseness in the front-rear direction (the Z1-Z2 direction).

As shown in FIG. 4 and FIG. 5, base portions of the two sheets of front supporting plate spring 40 are disposed on the plate spring attachment surfaces 16 of the peripheral wall portion 12 of the front case 10 toward the rearward respectively. The positioning protrusion 17 protruding from the plate spring attachment surface 16 are fitted into one of holes 43 which are formed on the front supporting plate spring 40, whereby the front supporting plate spring 40 is positioned at a rear portion of the front case 10. Attaching screws 45 are inserted into attaching holes 41a of the attachment base portion 41 of the front supporting plate spring 40 respectively and is threadedly fixed to the female thread hole which is formed on the plate spring attachment surface 16. Thereby, the base portion of the front supporting plate spring 40 is positioned on and fixed to the plate spring attachment surface 16 of the front case 10.

As shown in FIG. 4 and FIG. 5, the rear operation body 32 of the operation body 30 is elastically biased to the front case 10 by the pair of front supporting plate springs 40, 40.

Thereby, the rear operation body 32 is supported so as not to be moved in the right-left direction (the X1-X2 direction) and the up-down direction (the Y1-Y2 direction). Moreover, the plurality of abutment protrusions 38 which are provided on the rear operation body 32 meet the operation body supporting surface 18 of the front case 10 due to the elastic force of the elastic support portions 42 of the pair of front supporting plate springs 40. Subsequently, when external force is not applied to the operation body 30, the operation body 30 is connected in a state in which the attitude thereof is stable without looseness with respect to the front case 10 in the front-rear direction (the Z1-Z2 direction).

In the operation body 30, the rear operation body 32 is pressed to and supported on a rear surface of the front case 10, however the front operation body 31 is exposed through the opening portion 13 of the front case 10. Therefore, it is possible to move the front operation body 31 and the rear operation body 32 together by operating the operation surface 31a of the front operation body 31.

When any location of the operation surface 31a having been pressed rearward (the Z2 direction) by user's finger, the elastic support portion 42 of the front supporting plate spring 40 is elastically deformed. Thereby, it is possible for the rear operation body 32 to be moved around the abutment portion between the abutment protrusion 38 and the operation body supporting surface 18 of the front case 10 as a fulcrum. Since the size of the operation surface 31a of the front operation body 31 is larger than the size of the tip of a user's finger, the attitude of the operation body 30 is changed corresponding to the position on the operation surface 31a where user's finger presses.

As shown in FIG. 3, a bottom wall portion 21 and a side wall portion 22 which covers four side surfaces thereof are integrally formed in the rear case 20. The end surface of the side wall portion 22 toward the frontward (the Z1 direction) is a plate spring supporting surface 23.

As shown in FIG. 2, a rear supporting plate spring 50 is disposed in the rearward (the Z2 direction) of the rear operation body 32. Moreover, a flexible print substrate 60 is superimposed on the rear supporting plate spring 50 (that is, a second elastic support member) in the frontward. As shown in FIG. 3, the rear supporting plate spring 50 and the flexible print substrate 60 are superimposed, and the front case 10 and the rear case 20 are bonded to each other in a state in which the superimposed rear supporting plate spring 50 and flexible print substrate 60 is mounted on the plate spring supporting surface 23 of the rear case 20. At this time, a peripheral portion 51 of the rear supporting plate spring 50 and a peripheral portion 61 of the flexible print substrate 60 are interposed between the plate spring supporting surface 23 of the front case 20 and the binding surface 15 of the front case 10.

As shown in FIG. 4, on a part of the binding surface 15 of the front case 10, female thread holes 19 are formed in four places. On the rear case 20, attaching holes are formed at positions corresponding to the female thread holes 19 respectively. The front case 10 and the rear case 20 are assembled and then a fixing screw, which is inserted into the attaching hole of the rear case 20, is threadedly fixed to the female thread hole 19 of the front case 10. Thereby, the front case 10 and the rear case 20 are fixed to each other. By the fixing force thereof, the peripheral portion 51 of the rear supporting plate spring 50 and the peripheral portion 61 of the flexible print substrate 60 are interposed and firmly fixed between the front case 10 and the rear case 20.

As shown in FIG. 2 and FIG. 6, an opening portion 52 is formed at the center of the rear supporting plate spring 50. On a right side portion 51a of the peripheral portion 51 of the rear supporting plate spring 50, a pair of first elastic support portions 53 are integrally formed at up and down side with an interval therebetween. Also, a second elastic support portion 54 is integrally formed between the two up and down first elastic support portions 53, 53. Likewise, on a left side portion 51b of the peripheral portion 51, the pair of first elastic support portions 53, 53 and the second elastic support portion 54 are integrally formed.

All of the first elastic support portions 53 which are formed in four places have the same shape and the same size. The first elastic support portions 53 are arranged symmetrically in the right-left direction on the right side portion 51a and the left side portion 51b and extend toward the opening portion 52. The second elastic support portions 54 which are formed in two places have the same shape and the same size. Also, the second elastic support portions 54 are arranged symmetrically in the right-left direction in the right side portion 51a and the left side portion 51b and extend toward the opening portion 52.

As shown in FIG. 2, an appearance of the flexible print substrate 60 is almost the same as the rear supporting plate spring 50. On the flexible print substrate 60, first deformable pieces 63 are arranged symmetrically in the right-left direction in four places in total of two right places and two left places. The first deformable piece 63 is deformable in the front-rear direction (the Z1-Z2 direction) through a slit, which is formed on the flexible print substrate 60 except the base portion thereof. At the position where the first elastic support portion 53 of the rear supporting plate spring 50 is superimposed thereon the first deformable pieces 63 which is provided in four places are formed in almost the same size of the first elastic support portion 53.

Therefore, the elastic modulus of the front supporting plate spring 40 and the rear supporting plate spring 50 can be set independently, whereby it is possible to set an amount of deformation of the rear supporting plate spring 50 of when the pressing operation force imparted to the operation surfaces is the maximum within the maximum operating range of an actuator of the detection member. Subsequently, it is possible for the detection member to not be broken by the pressing operation.

On the flexible print substrate 60, second deformable pieces 64 are arranged at two right and left places symmetrically in the right-left direction. Likewise, the first deformable piece 63, the second deformable piece 64 is deformable in the front-rear direction (the Z1-Z2 direction) through a slit, which is formed in the flexible print substrate 60 except the base portion thereof. The second deformable pieces 64 disposed in two places are formed at the position where the second elastic support portion 54 of the rear supporting plate spring 50 is superimposed on.

Each of the first deformable pieces 63 are superimposed on a surface of the first elastic support portion 53 toward frontward (the Z1 direction). Likewise, each of the second deformable pieces 64 is superimposed on a surface of the second elastic support portion 54 toward frontward. The first elastic support portion 53 and the first deformable piece 63 are fixed to each other using an adhesive agent, and the second elastic support portion 54 and the second deformable piece 64 are fixed to each other using adhesive agent.

Figure 7:
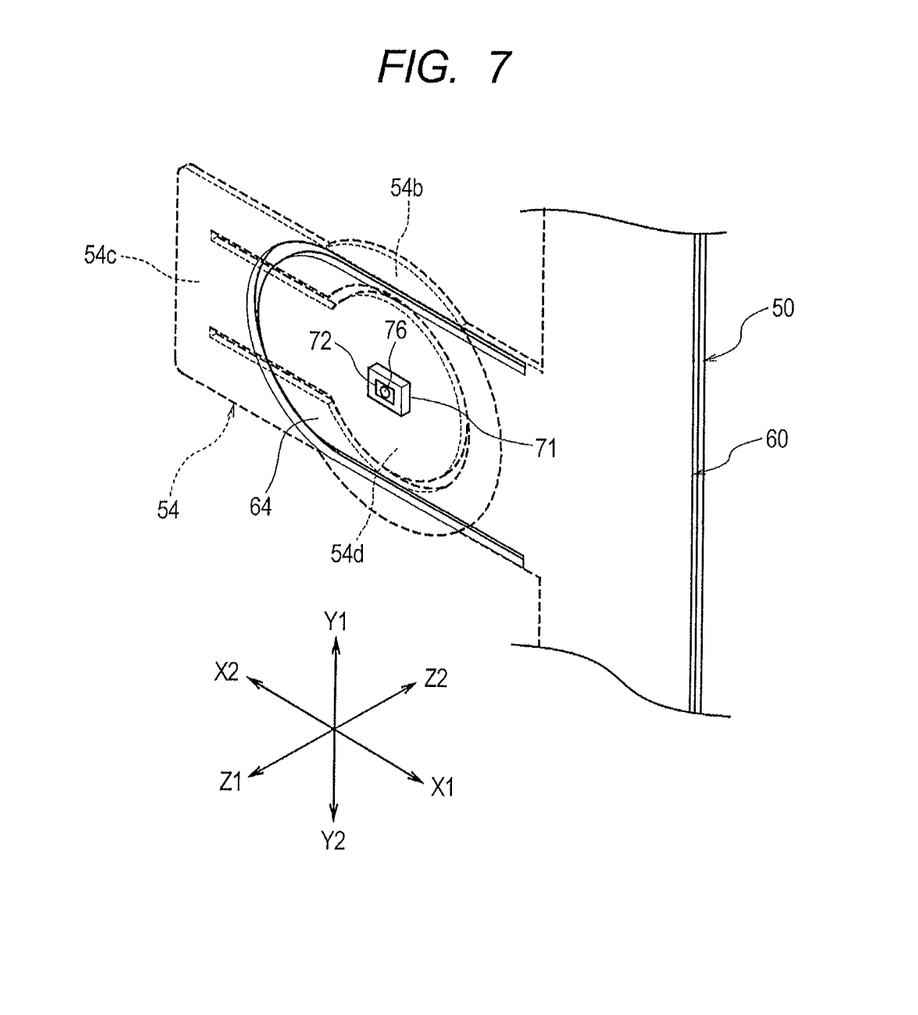
FIG. 7 is a partial perspective view showing a state in which the detection member is mounted on the plate spring and a flexible print substrate.

As shown in FIG. 2 and FIG. 7, in the flexible print substrate 60, the detection members 70 are attached on four surfaces of the first deformable pieces 63 toward the frontward (the Z1 direction) and on two surfaces of the second deformable pieces 64 toward the frontward respectively.

Figure 8:
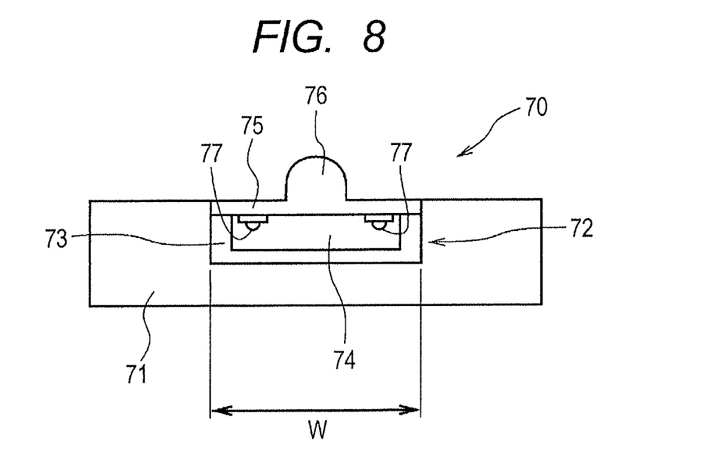
FIG. 8 is a cross-sectional view of the detection member.

FIG. 8 shows a cross-section of the detection member 70. In the detection member 70, a pressure sensor 72 is supported on the quadrangular-shaped base part 71. Here, the pressure sensor 72 is a Micro Electro Mechanical Systems (MEMS) sensor with a fine structure. In the schematic structure thereof, an operation space 74 is formed inside a fine housing 73, which is formed by laminating silicon wafers. A movable layer 75, which is an upper layer of the fine housing 73, is flexibly deformable, and a protrusion-shaped actuator 76 is formed on the upper surface of the movable layer 75. On an inner surface of the movable layer 75, a detecting element 77 such as a piezoelectric element is attached. When the actuator 76 is pressed, the movable layer 75 is flexibly deformed. The amount of flexible deformation thereof is detected by the detecting element 77.

The pressure sensor 72 is also called a force detecting sensor (a force sensor). The pressure sensor 72 not only detects the existence or nonexistence of force imparted to the actuator 76, but also output's variable outputs corresponding to a magnitude of the imparted force. The width size W of the pressure sensor 72 of a MEMS sensor is approximately 1 to 2 mm. The diameter of the actuator 76 is approximately 0.2 mm, and the maximum stroke thereof is 10 to 30 μm. That is, when the operation surface 31a has been pressed by user's finger, the maximum operating range of the actuator 76 of the pressure sensor 72 is sufficiently shorter than the maximum stroke of when the operation body 30 is moved toward rearward (the Z2 direction).

A wiring pattern is formed on a surface of the flexible print substrate 60 toward frontward (the Z1 direction), and each of detecting terminals of the detection member 70 is conducted to the wiring pattern.

As shown in FIG. 2 and FIG. 3, the pressing protrusion 39 protruding rearward is integrally formed on the rear operation body 32. The pressing protrusions 39 are disposed in six places in the same numbers as the detection members 70. As shown in FIG. 7, in the detection member 70 mounted on a surface of the flexible print substrate 60, the actuator 76 is disposed toward frontward (the Z1 direction). As shown in FIG. 3, in a state in which the front case 10 and the rear case 20 are assembled, each of pressing protrusions 39 abuts on the actuator 76 of the detection member 70 and the actuator 76 is pushed against a tip surface of the pressing protrusion 39 by the first elastic support portion 53 and the second elastic support portion 54 which are provided on the rear supporting plate spring 50 with initial pressure (that is, initial suppress strength).

FIG. 6 is a rear view of the input device 1 seen from the rearward of the rear supporting plate spring 50. In FIG. 6, in the first elastic support portion 53 of the rear supporting plate spring 50, a center point of the support portion where the pressure sensor 72 is supported is designated as (a). The center point (a) is a center point of the actuator 76 shown in FIG. 8. Also, the center point (a) is an abutment point between the pressing protrusion 39 of the rear operation body 32 and the actuator 76. Moreover, in the second elastic support portion 54, a center point of the support portion where the pressure sensor 72 is supported is designated as (b). Likewise, the center point (b) is a center point of the actuator 76 and is an abutment point between the actuator 76 and the pressing protrusion 39. As shown in FIG. 6, the center points (a) in four places and the center points (b) in two places are positioned along an imaginary perfect circle φ of which the center of curvature thereof is the center (the centroid) O1 of the rear operation body 32.

since the rear supporting plate spring 50 has a rectangular shape, each of two distances L2 which is a distance from a base end portion 54a of the second elastic support portion 54 to the center point (b) is shorter than each of four distances L1 which is a distance from a base end portion 53a of the first elastic support portion 53 to the center point (a). Meanwhile, the second elastic support portion 54 includes a first deformation portion 54b which extends from the base end portion 54a toward a free end 54c and a second deformation portion 54d which is formed on the first deformation portion 54b and extends from the free end 54c toward the base end portion 54a. The center point (b) where the pressure sensor 72 is supported is positioned on the second deformation portion 54d.

Although the distance L2 is shorter than the other, the second elastic support portion 54 includes the first deformation portion 54b and the second deformation portion 54d. Thereby, the practical free length from the base end portion 54a to the center point (b) can be extended so as to be able to lower the elastic modulus. Subsequently, the elastic modulus thereof can be set to a value closer to the elastic modulus of the first elastic support portion 53. More preferably, the elastic modulus thereof can be set to the same value of the first elastic support portion 53. As a result, when the center point (a) and the center point (b) are pressed in the rearward (the Z2 direction) by the same distance, the amount of the elastic reaction force which is applied from the first elastic support portion 53 to the center point (a) can be closer to the amount of the elastic reaction force which is applied from the second elastic support portion 54 to the center point (b). More preferably, it is possible to be set to the same value.

When the operation surface 31a of the front operation body 31 has been pressed, a stroke of when the rear operation body 32 is moved to the rearward is sufficiently longer than the operation stroke of the actuator 76 of the pressure sensor 72. Therefore, when the rear operation body 32 is moved in the rearward and the actuator 76 is pressed in the rearward by the pressing protrusion 39, the first elastic support portion 53 and the second elastic support portion 54 of the rear supporting plate spring 50 are elastically deformed. Thereby, in the pressure sensor 72, the actuator 76 is pushed by the reaction force of the elastic deformation such that the movable layer 75 is deformed. Therefore, a detection output of a magnitude corresponding to the force, which is applied to the actuator 76, is obtained from the detecting element 77.

At this time, in the flexible print substrate 60, the first deformable piece 63 and the second deformable piece 64, which support the detection member 70, are freely deformable. Thereby, an unnecessary bearing resistance force may not be imparted to the pressure sensor 72. Subsequently, there is no concern that the pressure sensor 72 is to be broken by excessive pressure being applied. Subsequently, a pressure sensor which is small in size in the height direction can be adopted, such that it is possible to make the input device thin.

Figure 9:
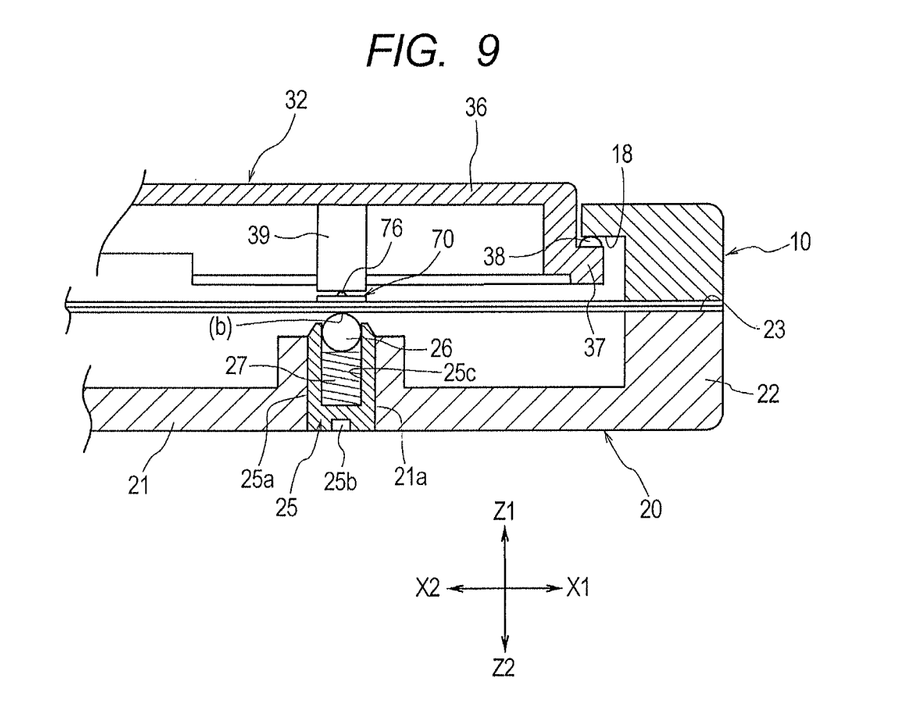
FIG. 9 is a partial cross-sectional view showing another embodiment of an elastic support portion which supports the detection member.

As shown in FIG. 9, a bearing capacity adjustment member 25 may be provided in the rear case 20. Also, a male thread 25 is formed around the bearing capacity adjustment member 25 such that the bearing capacity adjustment member 25 is threadedly fixed to a female thread hole 21a, which is formed on the bottom wall portion 21 of the rear case 20. In a head portion of the bearing capacity adjustment member 25, a slit 25b to apply rotation thereto using a tool is formed. A press ball 26 of a press member is held in a tip portion of a hollow portion 25c of the bearing capacity adjustment member 25, and a helical compression spring 27 is accommodated inside the hollow portion 25c.

The bearing capacity adjustment member 25 is formed in six places of the rear case 20. The press balls 26 are disposed at the same positions of the center point (a) and (b) of the support portion of the pressure sensor 72 where the rear suppressing plate spring 50 supports thereof respectively, as shown in FIG. 6. Also, each of the press balls 26 abuts on a rear surface of the rear supporting plate spring 50. Therefore, the pressure sensor 72 pushed against the pressing protrusion 39 is sustained by both elastic reaction forces of which one is the elastic reaction force of the first elastic support portion 53 or the second elastic support portion 54 of the rear supporting plate spring 50 and the other is the elastic force of the helical compression spring 27 of the bearing capacity adjustment member 25. That is, an elastic support portion includes both of the first elastic support portion 53 or the second elastic support portion 54 and the helical compression spring 27.

Each of screwing quantities of the bearing capacity adjustment members 25 to the female thread hole 21a is adjusted such that the support reaction forces of the pressure sensors 72 which are pushed against the pressing protrusions 39 can be adjusted individually. Each of the screwing quantities of the bearing capacity adjustment members 25 is adjusted individually such that it is possible to implement adjustment work which makes initial detecting outputs of the pressure sensors 72 provided in six places identical in an initial state in which external force is not applied to the operation surface 31a.

Next, an input operation of the input device 1 will be described.

The rear operation body 32 is pushed against the front case 10 in a state of being biased elastically by the front supporting plate springs 40, 40. Thereby, when the front operation body 31 is not operated, the entire operation body 30 is held on the front case 10 in a stable attitude. Subsequently, even when vehicle body vibration acts or gravity acts in an inclined direction, the input device 1 is hardly moved. However, when any place of the operation surface 31a of the front operation body 31 has been pressed, it is possible for the front operation body 31 and the rear operation body 32 to be integrally moved toward the rearward (the Z2 direction). At this time, it is possible to move the rear operation body 32 through bending deformation or torsional deformation of the pair of elastic support portions 42, 42 of the front supporting plate spring 40, 40.

The elastic support portion 42 is formed in a quadrangular shape with a predetermined size. Also, the elastic support portion 42 is positioned in and firmly fixed to the rear operation body 32. Moreover, the elastic support portion 42 pushes the rear operation body 32 against the front case 10 in an elastically biased manner. Thereby, it is difficult for the rear operation body 32 to be moved in the right-left direction (the X1-X2 direction) and in the up-down direction (the Y1-Y2 direction) which are the in-plane direction of the elastic support portion 42. However, large numbers of holes 43 open on the elastic support portion 42 such that rigidity of the bending deformation and the torsional deformation can be adjusted to an optimum state. Thereby, when the operation surface 31a is pressed by user's finger, it is possible to move the front operation body 31 and the rear operation body 32 in the rearward (the Z2 direction) by suitable reaction force. Moreover, the frame part is formed in the periphery of the elastic support portion 42 and large numbers of the holes 43 are formed in a square shape such that stiffness of the elastic support portion 42 are maintained highly in the in-plane direction thereof.

Since the operation surface 31a of the front operation body 31 has a sufficiently wide size compared to that of user's finger, an attitude of the operation body 30 of when being pressed differ in accordance with a position of the operation surface 31a having been pressed. When the operation surface 31a has been pressed, the rear operation body 32 is moved in the rearward around abutment portion between two of the abutment protrusions 38 and the operation body supporting surface 18 of the front case 10 as a fulcrum. For example, the rear operation body 32 is moved rotationally around two of the abutment protrusions 38 which are disposed on a support line S1 shown in FIG. 6 as a fulcrum as well as around the support line S1 as a center thereof or is moved rotationally around two of the abutment protrusions 38 which are positioned on a support line S2 or on a support line S3 as a fulcrum. Also, the rear operation body 32 may be moved around one of the abutment protrusions 38 as a supporting depending on a pressed position of the operation surface 31a, and all of the abutment protrusions 38 may be moved in the rearward (the Z2 direction) by separating from the operation body supporting surface 18 together when the center O1 has been pressed.

Any of the actuators 76 of the pressure sensors 72 provided in six places are pressed by operation of the rear operation body 32, whereby detection outputs corresponding to a pressing force are obtained from the pressure sensors 72 respectively. In a computing unit (not shown), the position of the operation surface 31a pressed is computed as a position in the X-Y coordinate through the detection outputs from the pressure sensors 72.

In a main control unit, control operation is carried out corresponding to a press coordinate position of the operation surface 31a based on the computing result of the position of the operation surface 31a pressed.

As shown in FIG. 6, the six pressure sensors 72 are arranged on the imaginary perfect circle φ of which the center of curvature is the center O1 of the rear operation body 32. That is, all of the pressure sensors 72 are arranged symmetrically with respect to the right-left centerline Ox and the up-down centerline Oy and are disposed spaced at equal distances from the center O1. Thereby, for example, when a pressed position is shifted from a state in which the center O1 of the operation surface 31a is pressed by user's finger to a position in any direction thereon, it is easy to obtain output changes corresponding to movement distances from the center O1.

Furthermore, the number of the pressure sensors 72 may be four.

Also, the flexible print substrate 60 may be mounted to a rear surface of the rear operation body 32. Thereby, the detection members 70 may be attached on surfaces of the first deformable pieces 63 and the second deformable pieces 64 of the flexible print substrate 60 which are toward the Z2 side such that the pressing protrusions 39 may abut on the surfaces of the first deformable piece 63 and the second deformable piece 64 which are toward the Z1 side. Subsequently, the actuators 76 may meet the first elastic support portion 53 and the second elastic support portion 54 on the rear supporting plate spring 50.

Although, the plate spring 40 has been adopted so as to elastically support the rear operation body 32, an elastically deformable elastic member such as an elastomer may be used as well. Also, the front operation body 31 and the rear operation body 32 may be integrally formed in the operation body 30.

It should be understood by those skilled in the art that various modifications, combinations, sub-combinations and alterations may occur depending on design requirements and other factors insofar as they are within the scope of the appended claims of the equivalents thereof.

What is claimed is:
1. An input device comprising:
an operation body which has an operation surface on which a pressing operation is performed;

a detection member which detects that the operation surface is operated; and a case having an opening portion on a front side thereof, wherein the case includes:
- the operation body which is disposed inside of the case such that the operation surface is exposed through the opening portion,
- a first elastic support member which elastically supports the operation body, and
- a second elastic support member which supports the detection member that is pressed by the operation body and is elastically deformed when the operation surface is operated, and wherein the operation body includes an abutment portion abutting on an inner surface of the case, wherein the first elastic support members are disposed on both sides of the operation body, and wherein the second elastic support member is configured of a single plate spring and has a plurality of elastic support portions which protrude from the plate spring and which support the plurality of pressure sensors respectively.

2. The input device according to claim 1, wherein the case includes a front case and a rear case which are connected to each other, wherein the first elastic support member is configured of a plate spring of which one side of the plate spring is attached to the front case or the rear case and the other side is attached to the operation body, wherein the detection member is configured of a plurality of pressure sensors, and wherein the second elastic supporting member is attached to the front case or the rear case.

3. The input device according to claim 1, wherein a part of the plurality of elastic support portions include a first deformation portion, which extends in a protruding direction and is elastically deformable, and a second deformation portion, which extends from a tip end side to a base end side of the first deformation portion and is elastically deformable, and wherein the second deformation portion supports the pressure sensor.

4. The input device according to claim 2, wherein a flexible print substrate is provided between the operation body and the plate spring, and a plurality of deformable pieces which are superimposed on the elastic support portions respectively are formed on the flexible print substrate, and the plurality of pressure sensors are attached on the deformable pieces respectively.

5. The input device according to claim 1, wherein the plurality of pressure sensors are arranged symmetrically in a right-left direction and in an up-down direction while interposing a center of the operation body, and a distance from the center to each of centers of the pressure sensors is the same.

\* \* \* \* \*